United States Patent [19]

Allington et al.

[11] Patent Number: 4,809,123
[45] Date of Patent: Feb. 28, 1989

[54] GROUND FAULT DETECTOR FOR HIGH-VOLTAGE DC POWER SUPPLIES

[75] Inventors: Robert W. Allington; Larry J. Friling, both of Lincoln, Nebr.

[73] Assignee: Isco, Inc., Lincoln, Nebr.

[21] Appl. No.: 851,740

[22] Filed: Apr. 14, 1986

[51] Int. Cl.⁴ .............................................. H02H 3/16
[52] U.S. Cl. ...................................... 361/42; 324/509
[58] Field of Search .................. 361/42, 44, 45, 47; 340/650; 324/509

[56] References Cited

U.S. PATENT DOCUMENTS

| | | | |
|---|---|---|---|
| 4,159,501 | 6/1979 | White | 324/509 X |
| 4,347,540 | 8/1982 | Gary et al. | 361/42 X |
| 4,375,660 | 3/1983 | Tate et al. | 361/42 X |
| 4,410,925 | 10/1983 | Tucker et al. | 361/42 |

*Primary Examiner*—A. D. Pellinen
*Assistant Examiner*—Derek S. Jennings
*Attorney, Agent, or Firm*—Vincent L. Carney

[57] ABSTRACT

To detect a ground fault, the alternating current leakage current to common AC electrical ground is sensed across a resistor and applied to one input of an analog gate. The analog gate is opened by the positive going voltage from the high-voltage secondary of the power supply transformers between 7 degrees from the crossover point and 103 degrees to pass only that portion of the potential representing the alternating current leakage current which is in phase with the potential on the secondary windings of the power supply transformer and thus provide a signal representing the real component of the AC impedance to ground. A reference preset level of impedance and the signal from the analog gate are compared to provide a signal whenever the real component of the AC leakage current exceeds the preset value.

29 Claims, 4 Drawing Sheets

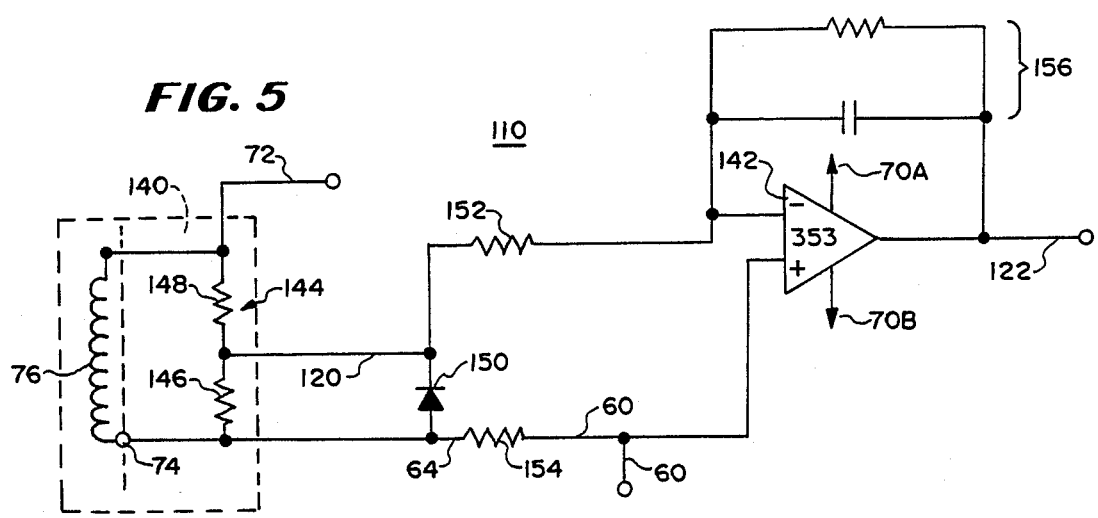
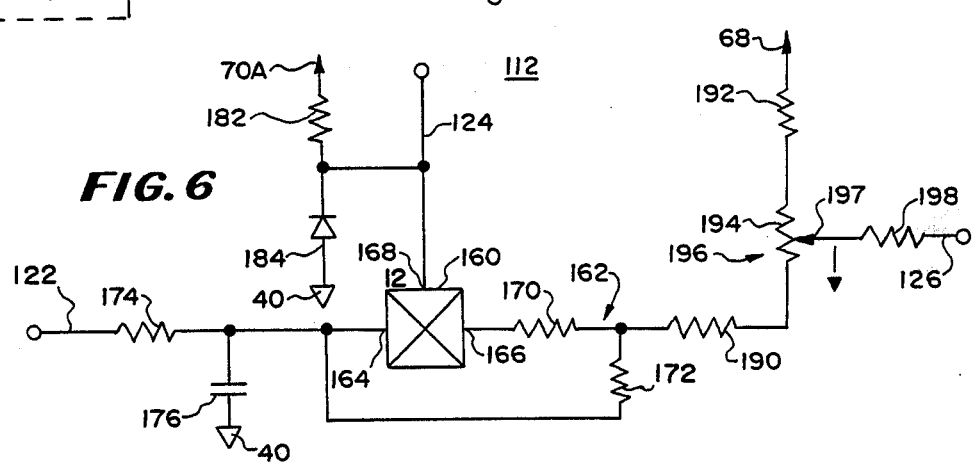
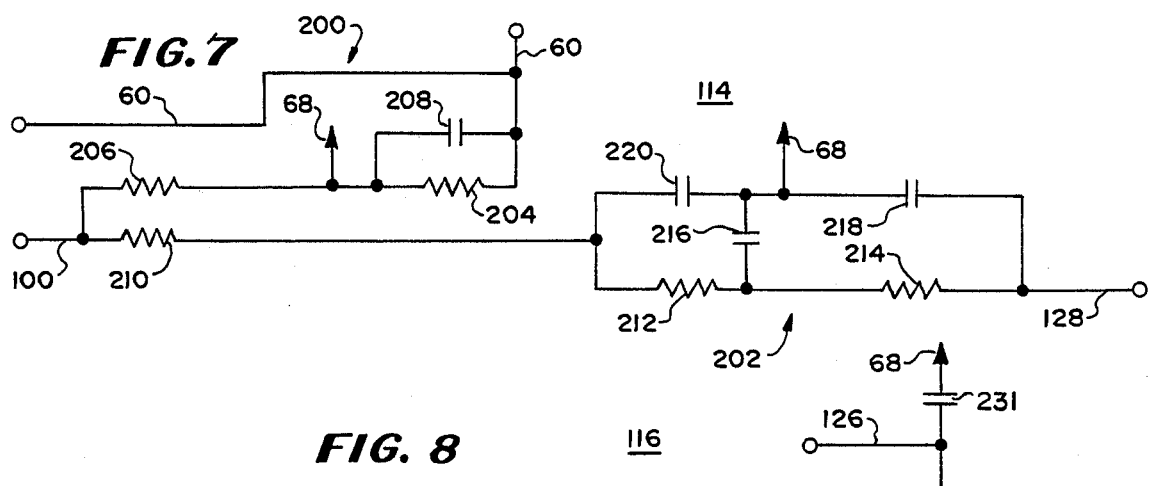
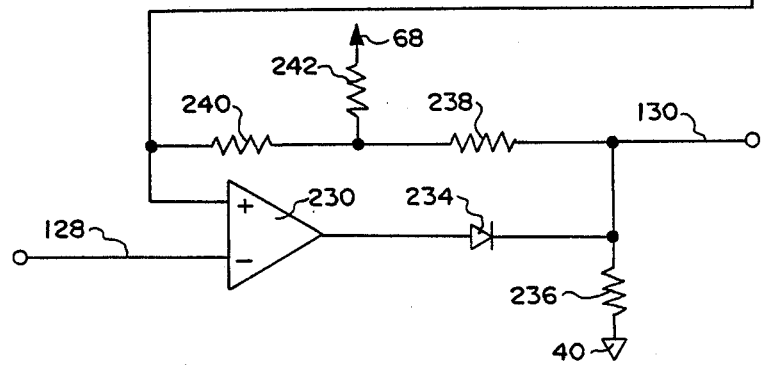

GROUND FAULT DETECTOR FOR HIGH-VOLTAGE DC POWER SUPPLIES

BACKGROUND OF THE INVENTION

This invention relates generally tog round fault detectors for direct current power supplies.

It is known to include in high-voltage DC power supplies a ground fault detector which measures leakage current to ground. Once the leakage current reaches a predetermined value, an alarm is provided or a warning system or the high-voltage circuits of the power supply are automatically disconnected to prevent circuit errors or a possible hazardous condition.

In one type of prior art ground fault detector, the DC leakage current is measured, and when it reaches a level indicating an unacceptable ground fault condition, the mechanism is activated to provide a warning or to disconnect the high power circuits. It has the disadvantages of not detecting faults unless the high-voltage is already on.

Another type of ground fault detector measures AC fault impedance without the high-voltage being on. This type of ground fault detector is disclosed in U.S. Pat. No. 4,188,574.

This type of prior art ground fault detector has the disadvantage of being set at a level corresponding to a AC leakage current. Thus, it is activated unnecessarily by AC leakage current when the capacitance becomes large, and from time to time unnecessarily interrupts the operation of the power supply and equipment to which it is supplying power. The activation level is set too low because it is not set in accordance with the circuit conditions providing the largest safe capacitive charge.

An alternative to having the ground fault circuit activated unnecessarily in this type of prior art ground fault detector is to set the current level higher but this has the disadvantage of permitting an unacceptable DC leakage current when the leakage capacitive impedance is high.

SUMMARY OF THE INVENTION

It is an object of this invention to provide a novel ground fault detector.

It is a further object of this invention to provide a novel method for indicating ground faults.

It is still a further object of the invention to provide a novel ground fault detector for a high-voltage current that senses fault impedance, rather than current, so that ground faults are detected before the high-voltage is turned on.

It is a still further object of the invention to provide novel apparatuses and methods for detecting ground faults, which methods and apparatuses can be easily adjusted to indicate predetermined dangerous conditions across a wide range of capacitance to ground.

It is a still further object of this invention to provide a novel method and apparatus for detecting ground faults for DC power supplies by setting the condition for activation of the detector at a value of the real component of an AC impedance.

It is a still further object of the invention to provide a novel apparatus and method for detecting ground faults which measure the real component of AC leakage current and provide a warning or to terminate the high power when the real component of AC leakage current exceeds a predetermined amount.

It is a still further object of this invention to provide a novel apparatus and method for detecting the magnitude of the AC leakage current which is in phase with the AC high-voltage of the power supply.

It is a still further object of this invention to enable a ground fault level of impedance to be set as a standard in accordance with proper operating circuit conditions that permit the largest leakage current.

It is a still further object of the invention to provide a ground fault detection technique which automatically adjusts a permissible level of AC test leakage to take into consideration the acceptable circuit configurations that provide large reactance or large resistance.

In accordance with the above and further objects of the invention, a ground fault detector for a DC power supply measures the real component of the AC leakage current. The real component is compared against a preset level. When it exceeds that level, thus indicating an impermissible low impedance to AC ground from the high-voltage end of the power supply, the ground fault detector is activated. Upon activation, the ground fault detector gives an alarm or a series of alarms or disconnects the high-voltage.

Advantageously, the real component of AC impedance to ground is detected by generating a voltage which represents the AC leakage current and selecting a portion of that voltage which corresponds in phase to the AC potential of the power supply. The signal representing the real component of AC leakage current is compared against an adjustable, preset, level and, when the level is exceeded, any of several selected events may be caused to happen, such as: (1) an audible or visual indication of a ground fault may be provided; and/or (2) the power supply or the high voltage circuit of the power supply may be deenergized.

For further beneficial results, this preset level or the signal indicating the real component of AC leakage impedance can be corrected for shifts in the voltage output of the high-voltage end of the transformer and may be corrected to accommodate different ranges of voltage output of the power supply if such ranges are selected.

As can be understood from the above description, the method and apparatus for detecting ground faults in accordance with this invention has several advantages, such as: (1) it permits the leakage capacitance to AC ground to vary over a wide range without causing the ground fault condition to be activated; (2) it permits the power supply to be used in higher leakage capacitance configurations or with high capacitance equipment; (3) it is easily adjustable and adaptable to different circuit conditions; and (4) it enables the level of impedance to AC ground that is acceptable to have large capacitive AC leakage current and it does this by increasing the permissible value of admittance that is measured as the phase difference is increasedby leakage capacitance.

SUMMARY OF THE DRAWINGS

The above noted and other features of the invention will be better understood from the following detailed description when considered with reference to the accompanying drawings, in which:

FIG. 5 is a schematic circuit diagram of a portion of the level detector of FIG. 4;

FIG. 6 is a schematic circuit diagram of another portion of the circuit of FIG. 4;

FIG. 7 is schematic circuit diagram of another portion of the circuit of FIG. 4;

FIG. 8 is a schematic circuit diagram of still another portion of the block diagram of FIG. 4;

DETAILED DESCRIPTION

Figure 1:
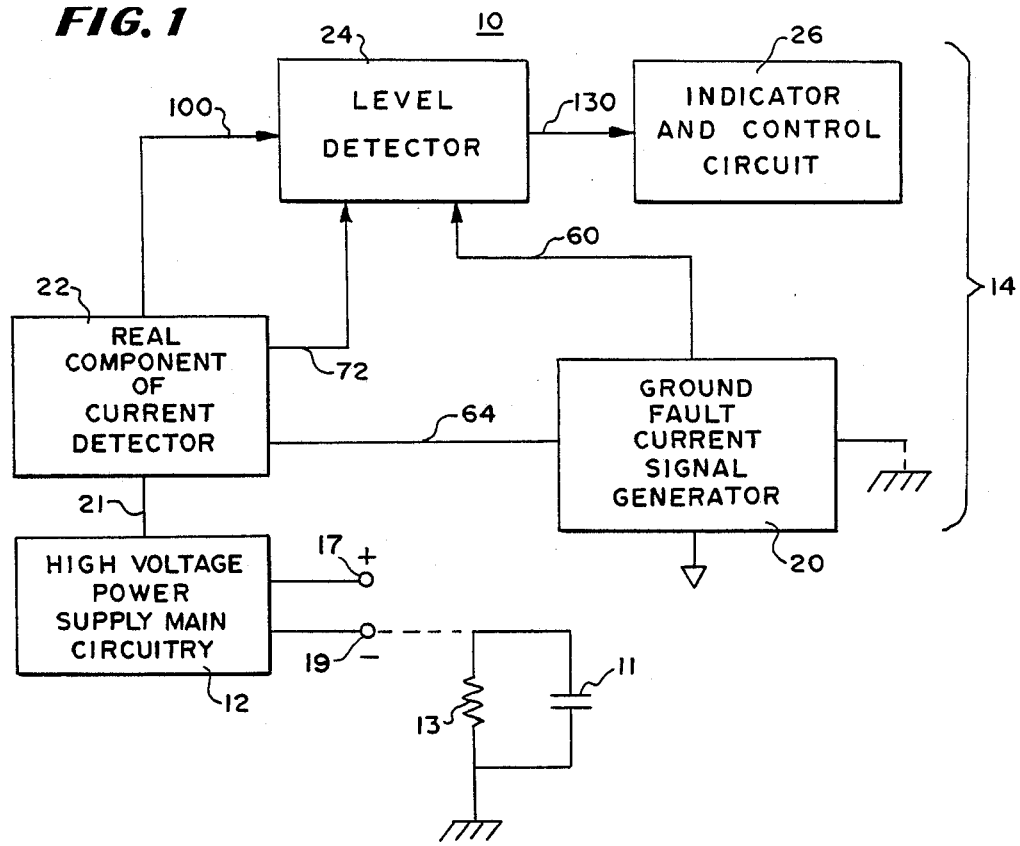
FIG. 1 is a block diagram showing a ground fault detector in accordance with an embodiment of the invention.

In FIG. 1, there is shown a power supply 10 having within it the high voltage power supply main circuitry 12 and a ground fault detector 14. The ground fault detector 14 is part of the power supply and is activated upon detecting a ground fault resistivity indicated by resistance 13 between either of the output terminals 17 or 19 of the high-voltage section of the power supply and common ground. The detector 14 has minimal sensitivity to ground capacitance 11 in parallel with ground fault resistance 13.

More specifically, the ground fault detector 14 is activated when the real component of the AC leakage current exceeds a predetermined level. Thus, the resistive component of a level of AC impedance between the high-voltage end of the power supply and common ground may be established at a fixed level so that when that resistive component of the impedance drops below the preset level, the circuit is energized to give an alarm and/or inactivate certain parts of the power supply in a predetermined manner to alleviate the dangerous condition that may exist.

The ground fault detector 14 includes a ground fault current signal generator 20, a real component of current detector 22, a level detector 24 and an indicator and control circuit 26. The ground fault current signal generator 20 is electrically connected through a conductor 64 to the real component of current detector 22 and through conductor 21 to the high voltage power supply main circuitry 12 and through a conductor 60 to the level detector 24 to generate a signal representing the AC leakage current in the high-power end of a floating secondary circuit of the direct current high-voltage power supply 10 and supply it to the real component of current detector 22 and to supply a reference signal to the level detector 24.

The real component of current detector 22 is electrically connected through the conductor 64 to the high voltage power supply main circuitry 12 and to the ground fault current generator 20 provide a return path for circuits and to receive a signal representing the AC leakage current. It is electrically connected to the level detector 24 through a conductor 100 through which it applies a signal representing only the real component of the AC leakage current. Thus, it applies a signal to the level detector 24 which represents the real component of the leakage impedance to ground of the secondary circuit of the power supply which is the resistive component of the AC leakage impedance.

The level detector 24 receives the signal representing the real component of AC leakage current on conductor 100 and compares it to a preset level. The preset level is corrected in the preferred embodiment to accommodate different ranges of output for the power supply and to accommodate shifts in voltage in the power supply. These corrections use signals received on conductor 120 by which it is electrically connected to the power supply main circuitry 12 and on conductor 60 as described above.

The level detector 24 is electrically connected through a conductor 130 to the indicator and control circuit 26 and applies to the indicator and control circuit 26 a signal indicating a ground fault or the absence of ground fault. The indicator and control circuit 26 responds with an alarm indicating a ground fault condition and/or by inactivating the high-voltage circuits. It may also provide data to be recorded or to be utilized by a microprocessor.

Figure 2:
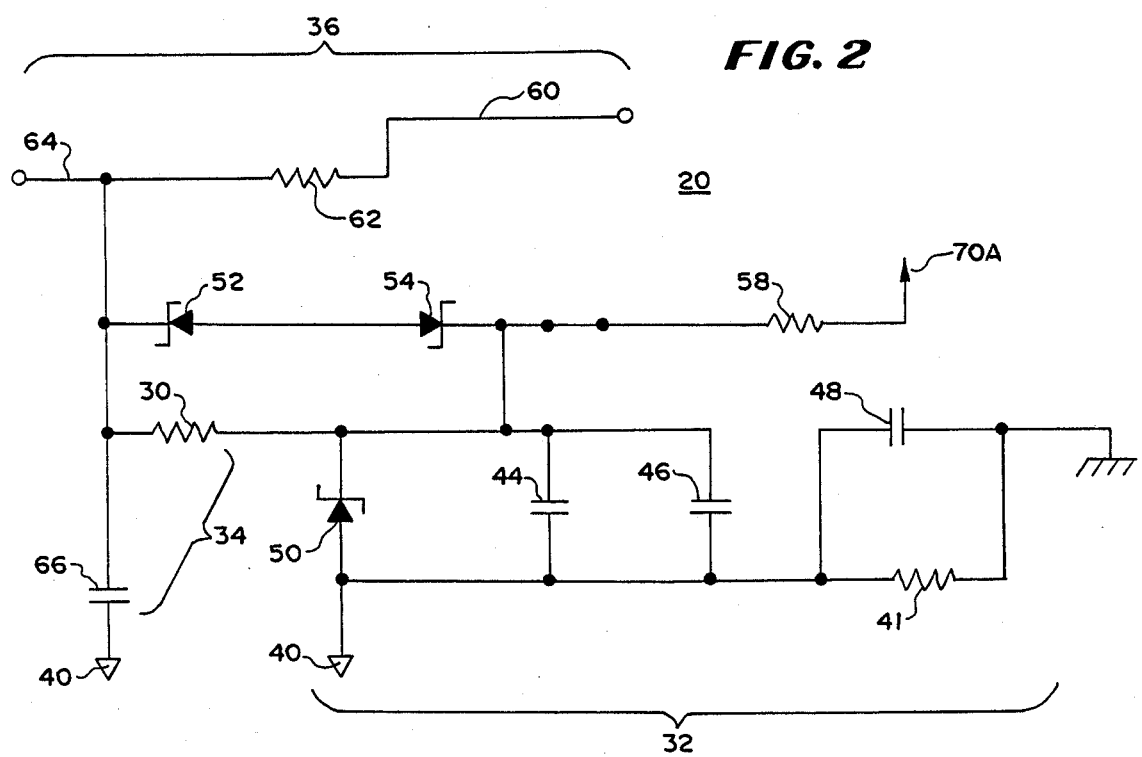
FIG. 2 is a schematic circuit diagram of a portion of the embodiment of FIG. 1 generally called in this specification a ground fault current signal generator.

In FIG. 2, there is shown a schematic circuit diagram of the ground-fault current, signal generator circuit 20 having a sensing impedance 30, a regulated power supply indicated generally at 32, a sensing impedance 34 and an output section indicated generally at 36. One end of the sensing impedance 30 is electrically connected to an output of the regulated power supply 32 to receive a constant 7.5 volt electrical potential and the other end is electrically connected to both the circuit and the output circuit 36 to generate a signal from current passing from the power supply to ground and to apply that signal to the output circuit 36.

The sensing impedance 34 in the preferred embodiment is composed of a 4.99K (kilohm) 1% resistor 30 and a 0.22 uf (microfarad) capacitor 66. The impedance of zener diode 50 and capacitors 44 and 46 are sufficiently low so that resistor 30 behaves to alternating currents as if it were connected in parallel with capacitor 66. Capacitor 66 prevents response to transients.

Different values and degrees of precision may be selected for different ground fault detectors in different power supplies in accordance with the needs of the circuit. Moreover, other circuitry may be used to generate a signal representing the AC impedance to ground. The impedance should be a resistance of adequate precision in a circuit path through which AC leakage current flows and thus be part of a complete circuit between AC ground and a constant regulated voltage source to conduct current modulated by any potential connected to the AC ground.

To provide a constant 7.5 volts to one end of the resistor 30, the regulated power supply 32 includes an electrical connection to common ground 40, two capacitors, 44 and 46, one zener diode 50, and a resistor 58. It has electrically connected to it, a souce 70A of a positive, direct current 15 volts with respect to circuit common which is regulated by the zener diode 50 to produce positive 7.5 volts for the rest of the ground fault circuitry. The source 68 is 7.5 volts and maintains AC ground at this value because of the low incremental impedance of zener diode 50 and capacitor 46. The ground fault current signal is referenced to 7.5 volts since analog gate 168's input can only be from zero to positive 15 volts.

Surge protection is provided by zener diode 54 and zener diode 52. The zener diode 50 is a 7.5 volt, 1 watt, 1N4737 diode and the zener diodes 52 and 54 are 5.6 volt, ½ watt, 1N5232B diodes.

To provide a complete circuit through common AC ground and the sensing impedance 34, the path 34 to ground includes a 0.1 200-volt capacitor 44 and a 10 uf 20 volt capacitor 46 each having one plate electrically connected to one end of the resistor 30 and to the output circuit 36 and its other plate electrically connected to common electrical ground 40.

With this arrangement, mains frequency AC current flows from the 800-volt winding 76 of a transformer (FIG. 3) through the path to AC ground 34, including capacitor 66 resistor 30 to provide a completed circuit which includes common electrical ground as a current sink, producing a potential drop across the resistor 30 to represent the AC leakage current. Common electrical ground is coupled to chassis or earth ground through 0.1 uf capacitor 48 and 47 kohm resistor 41. This provides sufficiently low impedance coupling so that common electrical ground and chassis or earth ground are at substantially the same potential and common electrical ground may be used in place of earth ground without significant effect upon circuit operation.

To provide signals to the level detector 24 (FIG. 1) through conductor 60 and to the real component of current detector (FIG. 1), the output circuit 36 includes conductors 60 and 64 and resistor 62. The conductor 64 is electrically connected to the cathode of the zener diode 52, one end of the sensing impedance 30, one plate of the capacitor 66, and to conductor 60 through the 4.7M (megohm) resistor 62.

Figure 3:
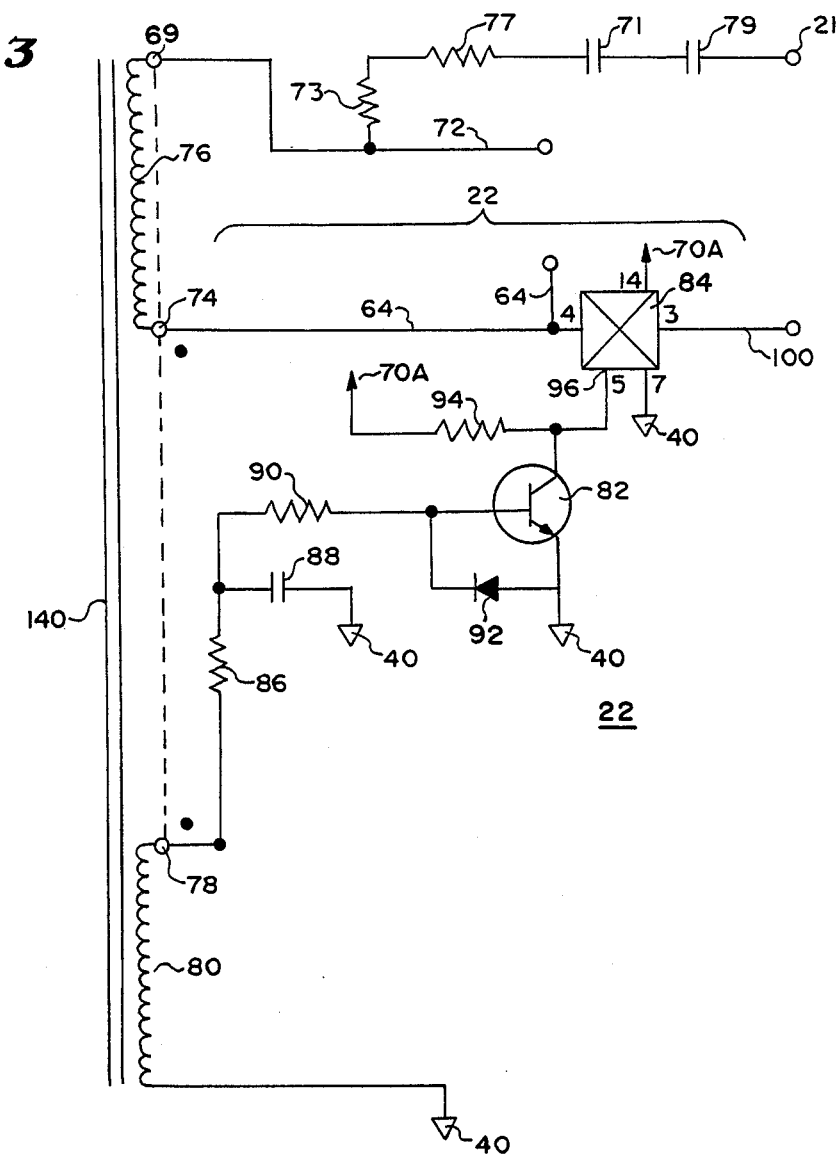
FIG. 3 is a schematic circuit diagram of another part of the embodiment of FIG. 1 generally referred to as a real component of current detector.

In FIG. 3, there is shown a schematic circuit diagram of the real component of current detector 22 electrically connected at 21 to the high voltage power supply main circuitry indicated at 12 in FIG. 1. The transformer 140 is connected to the power mains at its primary winding (not shown) and includes a low voltage secondary winding 80 and an 800 volt fault-sensing supply secondary winding 76 electrically connected at one end 74 to the real component of current detector 22 and at its other end 69 connected through coupling and isolating resistor 73 and 77 and coupling the isolating capacitor 71 and 79 to the high voltage supply main circuitry at 72. Resistor 73 is 390K, resistor 731 is 470K and capacitors 71 and 79 are both 0.0033 uf 6 kv.

The transformer winding 80 is a low voltage secondary winding electrically connected at its terminal 78 to the real component of current detector 22. In the preferred embodiment, the secondary winding 76 is an 800 volt rms (root mean square) winding and the secondary winding 80 is a 24 volt rms winding. The windings 76 and 80 are in phase.

To obtain the resistive component of AC current, the real component of current detector 22 includes an NPN transistor 82 and an analog switch 84. The transistor 82 is electrically connected to: (1) the transformer winding 80 to receive signals indicating the phase of the voltage in the secondary windings of the transformers; and (2) the analog gate 84 to cause that gate to pass a signal only corresponding to the portion of the AC leakage current signal that is in phase with the voltage in the secondary winding of the 800-volt transformer and block those components that are not in phase. With this arrangement, the gate 84 provides an indication of the resistive component of alternating current leakage impedance.

To control the transistor 82, its base is electrically connected to the end 78 of the transformer winding 80 through an 82K resistor 90 and a 7.15K 1% resistor 86 in series in the order named. To avoid response to transients and to provide a proper phase relationship, one plate of a 0.22 uf capacitor 88 is electrically connected to the resistors 86 and 90 and its other plate is connected to common ground 40. Capacitor 88 should be matched to within 2% of the capacitance of capacitor 66.

To avoid having the base of transistor 42 forced into reverse conduction by the negative going voltage from the transformer winding 80, a diode 92 has its anode electrically connected to the emitter of the transistor 82 and to common electrical ground 40 and is cathode electrically connected to the base of the transistor 82. The collector of the transistor 82 is electrically connected to the analog switch 84.

To provide a signal only representing the real component of leakage current that is in phase with the voltage at the output terminals 17 or 19 (FIG. 1), and is also nearly in phase with transformer voltage, the analog switch 84 has its: (1) control gate 96 electrically connected to the collector of the transistor 82 and to one end of a 56K resistor 94, the other end of the resistor 94 being electrically connected to the source 70A of a positive 15 volts; (2) input electrode electrically connected to conductor 64; and (3) output pin electrically connected to conductor 100. It is also supplied with power by the positive 15 volt source 70A.

The analog gate 84 in the preferred embodiment is a 4016 analog switch manufactured by Motorola, Inc. in Phoenix, Ariz. having pin 3 electrically connected to conductor 100, pin 4 connected to conduct 64, pin 5 electrically connected to the collector of the transistor 82, pin 7 electrically connected to circuit common 40 and pin 14 electrically connected to a source 70A.

With this circuit arrangement, the positive going voltage at terminal 78 of transformer secondary 80 is electrically connected to the base of the NPN transistor 82 and causes it to conduct, thus causing the voltage to decrease at its collector. The negative going voltage at terminal 78 although limited by the diode 92 or the base of the transistor 82, causes the transistor to shut off and its collector voltage to rise.

The positive going voltage on the collector of the transistor 82 when transistor 82 shuts off opens gate 84, causing conductor 64 to be electrically connected to the conductor 100. While conductor 64 is connected to conductor 100, it provides a DC signal representing the real portion of the signal representing the AC leakage current received on conductor 64 from the ground fault current signal generator 20 (FIG. 1 and FIG. 2) to conductor 100. The imaginary or capacitive portion of the signal, on the other hand, is connected to conductor 64 during a time interval in which gate 84 opens equal times instantaneously positive and negative so that there is no DC resultant signal on conductor 100 during this time interval because the positive and negative signals cancel each other.

The analog gate 84 should be opened (made conductive) when the potential at the secondary terminal 78 is at a point 28 degrees past the zero crossing and rising in a negative direction and preferably should be at 6 degrees from after the zero crossing potential at conductor 64. Once opened, the gate 84 should remain open only during the negative por tion of the alternating current cycle at lead 78 until approximately 28 degrees past the next zero crossing point between negative and positive half cycles of the transformer secondary potential and preferably for approximately one half cycle of the mains (usually 60 or 50 Hz.).

The portion of the in phase cycle and the time may be longer or shorter and it is possible to use either positive going or negative going signals to control the gate by design changes known in the art. Moreover, the amount of the real component which is utilized may vary from circuit to circuit. What is important is that a representative portion of the signal representing the in phase component of the leakage current be applied to conductor 100 or more generally that a signal be generated that represents a portion of leakage current, which portion increases as resistive leakage impedance increases and varies substantially less in response to capacitive leakage than to resistive leakage.

The resistance of the resistor 86 and the capacitance of capacitor 88 are selected to compensate for the impedance of capacitor 66 and resistor 30 (FIG. 2) and establish an approximate 6 degrees lagging relative phase shift to open gate 84. The 6 degree lag comensates for phase shifts elsewhere in the circuit, especially those caused by the resistance of resistors 73 and 77 and by the capacitance of capacitors 71 and 79.

Figure 4:
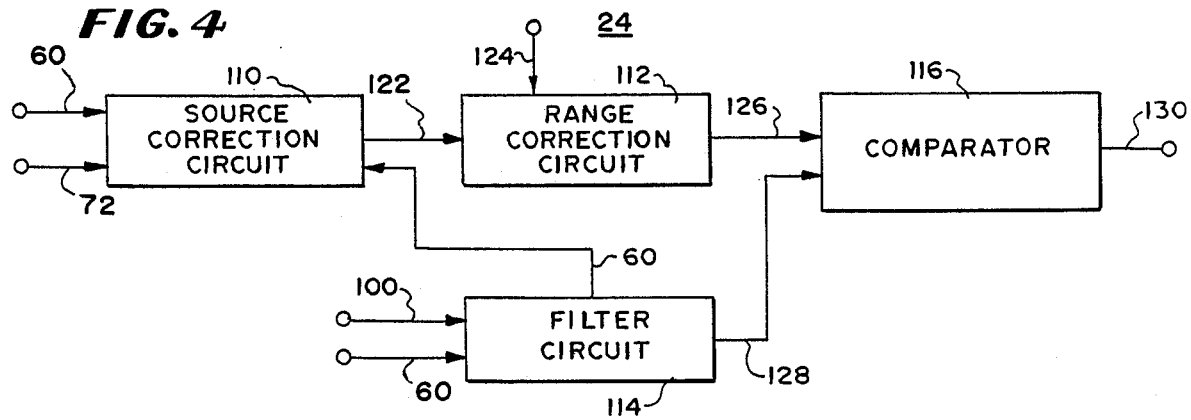
FIG. 4 is a block diagram of another portion of the embodiment of FIG. 1 generally referred to in this specification as a level detector.

In FIG. 4, there is shown a block diagram of the level detector 24, having a source correction circuit 110, a range correction circuit 112, a filter circuit 114 and a comparator 116.

To determine if there is a ground fault, the comparator 16 is electrically connected to: (1) the range correction circuit 112 to receive a signal level corrected as to a selected range of output potential of the power supply; and (2) the filter circuit 114 from which it receives a signal representing the real component of AC leakage current.

To automatically adjust the signal level selected as indicating a fault for variations in the input potential to the power supply, conductors 72 and 60 are electrically connected to the source correction circuit 110 from the power supply main circuitry 12 (FIG. 1), and the ground fault current signal generator 20 (FIG. 1 AND FIG. 2) to enable it to generate a signal representative of variations in the secondary potential of the output transformer of the high voltage power supply main circuitry 12 (FIG. 1). The source corrector circuit 110 is also electrically connected to the range correction circuit 112 through a conductor 122 to apply this correction signal representing variations in the output of the power supply to the range correction circuit 112.

To adjust the signal level selected as indicating a fault for different ranges of operation of the power supply, the range correction circuit 112 also receives signals through conductor 124 indicating the selection of ranges for the output of the power supply and the correction signals received on conductor 122 and 124 are processed to provide in a final correction signal. The range correction circuit 112 is electrically connected to one input of the comparator 116 through a conductor 126 where it is used to adjust the level applied to the comparator 130 against which the real component of AC leakage current signal is compared.

To reduce noise in the real component of current detector, the filter circuit 114 is electrically connected: (1) through conductor 100 to the real component of current detector 22 (FIG. 3) to receive a signal representing the real component of current; (2) through return conductor 64 to complete the AC circuit transformer winding 76 for the real component of leakage current signal; and (3) through conductor 128 to the other input of comparator 116 to provide a signal which is compared in the comparator 116 with a preset level received from range correction circuit 112 as adjusted by correction signals received across conductor 126.

To provide an output signal indicating a ground fault, the comparator 116 is electrically connected: (1) to conductor 126 and to conductor 128 to compare the real component of current signal received on conductor 128 with a preset level signal, corrected for range and voltage variations, received on conductor 126; and (2) through conductor 130 to the indicator and control circuit 26 (FIG. 1) to provide a signal thereto indicating a ground fault or a different signal indicating no ground fault.

In FIG. 5, there is shown a schematic circuit diagram of the source correction circuit 110 having a transformer part 140 and an operational amplifier 142. The operational amplifier 142 serves as a differential amplifier, being electrically connected to the transformer part 140 and to conductor 64 and 60 (FIG. 1) to generate a signal corrected for variations in potential from the transformer of the power supply 12 (FIG. 1).

The transformer part 140, illustrated schematically for convenience, includes the 800 volt transformer coil 76 and the terminal 74 which is electrically connected to conductor 64 as described above. It also shows resistive voltage divider 144 electrically connected across the winding 76 to generate voltages which are a fracton of but representative of the voltage across the secondary winding 76.

This voltage divider includes a resistor 146 and a resistor 148, the resistor 146 being 75K and the resistor 148 being 2250K (preferably composed of three 750K resistors in serires because the voltage across resistor 148 is too high for good reliability with a single, conventional resistor), the connecting point between the two being electrically connected to conductor 120. The entire resistance across the 800 volt winding 76 is 2,325K so that the voltage between conductor 64 and 120 is 1/31st of the total voltage if conductor 120 were not loaded by further circuit elements not yet described.

To connect the operational amplifier 142 to the conductors 60, 64 and 120, the connecting circuit includes diode 150, a resistor 152 and a resistor 154.

To remove negative going signals from conductor 120, the diode 150 has its anode electrically connected to conductor 64 and its cathode electrically connected to conductor 120 so that only voltages which are positive going between conductor 120 and 64 are connected to the operation amplifier 142, the others being shorted through diode 150.

To correct for voltage variations in winding 76, conductor 120 is electrically connected to the inverting terminal of the operational amplifier 142 through a 10M resistor 152 and the non-inverting input terminal of the operational amplifier 142 is electrically connected to the other low voltage end 74 of transformer winding 76 through the 10M resistor 154. The operational amplifier 142 is a LF353 JFET input operational amplifier manufactured by National Semiconductor, Santa Clara, Calif., having: (1) positive 15 and negative 15 rail voltage (shown at 70A and 70B respectively); and (2) a feedback from its output to its inverting input terminal containing in parallel a 1M resistor and a 0.15 uf capacitor in a feedback network 156.

This feedback network 156 provides a low pass filter characteristic with resistor 152, which filters the pedsating DC potential produced by rectification of the mains AC potential by diode 150. The output of the operational amplifier 142 is electrically connected to conductor 122 through which it applies a correction signal correcting for output voltage variations to the range correction circuit 112 (FIG. 4). This voltage represents a fixed fraction of the potential which is attempting to drive an AC test leakage signal through the high-voltage jacks to AC ground.

In FIG. 6, there is shown a schematic circuit diagram of the range correction circuit 112 having an analog switch 160, a voltage divider 162, an input electrode 164, a control electrode 168, and an output electrode 166. Range connector is desirable if the high voltage power supply main circuitry 12 (FIG. 1) has more than a single output voltage range. For example, for a 500 microampere maximum allowable leakage current, the minimum acceptable leakage resistance is 2 megohm if the power supply's maximum voltage is 1,000 volts, but is 8 megohms if the maximum voltage is 4,000 volts.

To provide a selected one of two different potentials to the comparator 116 (FIG. 4) through its output conductor 126, the voltage divider 162 includes a first 500K resistor 170 and a second 499K resistor 172 each having one end electrically connected to a resistor 190. The other end of the resistor 170 is electrically connected to output terminal 166 of the gate 160 and the other end of the resistor 172 is electrically connected to the input electrode 164 of the gate 160 so that, when the gate is closed by a signal on conductor 124, resistors 170 and 172 are electrically connected in parallel and when the gate is opened by different signal on conductor on 124, the circuit through resistor 170 is opened and resistor 172 is in series in the circuit to provide an increased resistance. The gate 160 is a 4016 analog switch manufactured by Motorola, Inc., Phoenix, Ariz.

To provide a signal that varies as the power supply input varies to the voltage divider 162, the conductor 72 is electrically connected to input terminal 164 of the gate 160 through a 10K resistor 174 and to a circuit common electrical ground 40 through a 10 uf filter capacitor 176. The DC circuit including resister 174 and capacitor 176 removes residual rectification pulsations from diode 150 (FIG. 5), plus some noise from the voltage divider 160.

The control conductor 124 is electrically connected to a positive source 70A of 15 volts through a 47K resistor 182 and is clamped with respect to common electrical ground 40 through the reverse resistance of a 1N273 diode 184. Diode 184 prevents pin 12 of the 4016 analog gate 160 from going below negative 0.3 volts which will damage the 4016 analog gate 160.

To permit adjustment of the ground fault trip level, the voltage divider 162 is electrically connected to conductor 126 through a potentiometer circuit for adjusting that level. This circuit includes a first 34.8K resistor 192, a 50K potentiometer resistance 194, and a 34.8K resistor 190. One end of the resistor 190 is electrically connected to the voltage divider 162, its other end being connected to one end of the potentiometer resistance 194. The resistor 192 has one end electrically connected to the positive source 68 of 7.5 volts and its other end electrically connected to the potentiometer resistance 194 to provide a voltage drop corrected by the input signal from voltage divider 162.

To permit adjustment of the level of the real component of the leakage current, the center tap 196 of the potentiometer 194 is electrically connected to conductor 126 through a 1.8M resistor 198 which, if exceeded, will activate the ground fault circuit, and which if not exceeded, will provide a signal that there is no ground fault.

In FIG. 7 there is shown the filter circuit 114, having a voltage variation correction filter circuit 200 and a real component of leakage current signal filter 202 to provide a filtered signal representing the real component of leakage current to the comparator 116 (FIG. 4) through conductor 128 and a correction current for voltage correction through the source correction circuit 110 (FIG. 4) through conductor 60.

The voltage variation correction circuit 200 is electrically connected to conductor 100 and to conductor 60 to provide an adjustment voltage on conductor 100 to the signal on conductor 60. The 0.15 uf capacitor 208 and the 1M resistor 204 provide filtering action on conductor 60. The real component of leakage current filter circuit 202 is electrically connected to conductor 100 and filters the signal before applying it to conductor 128. A source 68 of a positive 7.5 volts is electrically connected to conductor 100 through the resistor 206.

To filter noise and remove pulsations due to the synchronous mains frequency rectification provided by gate 84 (FIG. 3) from the real component of current leakage signal, the real component of leakage signal filter 202 includes three resistors 210, 212, and 214 and three capacitors 216, 218, and 220. The resistor 210 is a 150K resistor having one end electrically connected to conductor 100 and its other end electrically connected to conductor 128 through two paths, which are: (1) the 470K resistor 212 and the 1.5M resistor 214 in series; (2) the 0.15 uf capacitor 220 and the 0.15 uf capacitor 218 in series.

The 0.047 uf capacitor 216 has one plate electrically connected to the connecting plates of capacitors 220 and 218 and to a source 68 of 7.5 volts and has its other plate electrically connected to one end of each of resistors 212 and 214.

In FIG. 8, there is shown a schematic circuit diagram of the comparator 116 having an operational amplifier 230. The operational amplifier 230 has its inverting input terminal electrically connected to conductor 128 to receive the real component of leakage current signal and its non-inverting input terminal electrically connected to conductor 126 to receive a signal representing the preset level for a ground fault.

The output of the operational amplifier 230 is electrically connected to conductor 130 through the forward resistance of diode 234 to provide a signal indicating a ground fault or no ground fault. Conductor 130 is also electrically connected to common electrical ground through a 10K resistor 236 and to the non-inverting input terminal of the operational amplifier 230 through resistance 238 and 240 in series in the order recited. A source 68 of a positive 7.5 volts is electrically connected through resistor 242 to resistors 238 and 240 and is electrically connected to conductor 126 through a capacitor 230.

The resistors 236, 238, 240 and 242 are respectively 10K, 3.3M, 10M, and 4.7K and the capacitor 230 is 0.068 mf. The diode 234 is a CR321 1N914 diode and the operational amplifier 230 is the other half of operational amplifier in the circuit 142 or LF353 JFET input operational amplifier manufactured by National Semiconductor, Santa Clara, Calif.

With this circuit arrangement, the ground fault level signal is applied to conductor 126 corrected for voltage variations in the power supply and range selection and the real component of leakage current signal is applied to conductor 128 for comparison in the operational amplifier 230. If the real component of leakage current signal is sufficiently high to indicate an undesirable fault. The voltage on conductor 128 will be lowered below the level signal on conductor 126 and a positive going signal is applied to the anode of diode 234. Otherwise, resistor 236 provides a common potential to conductor 130, and transmitted to the indicator and control circuit 26 (FIG. 1) to deactivate the ground fault detector and turn off LED display.

Figure 9:
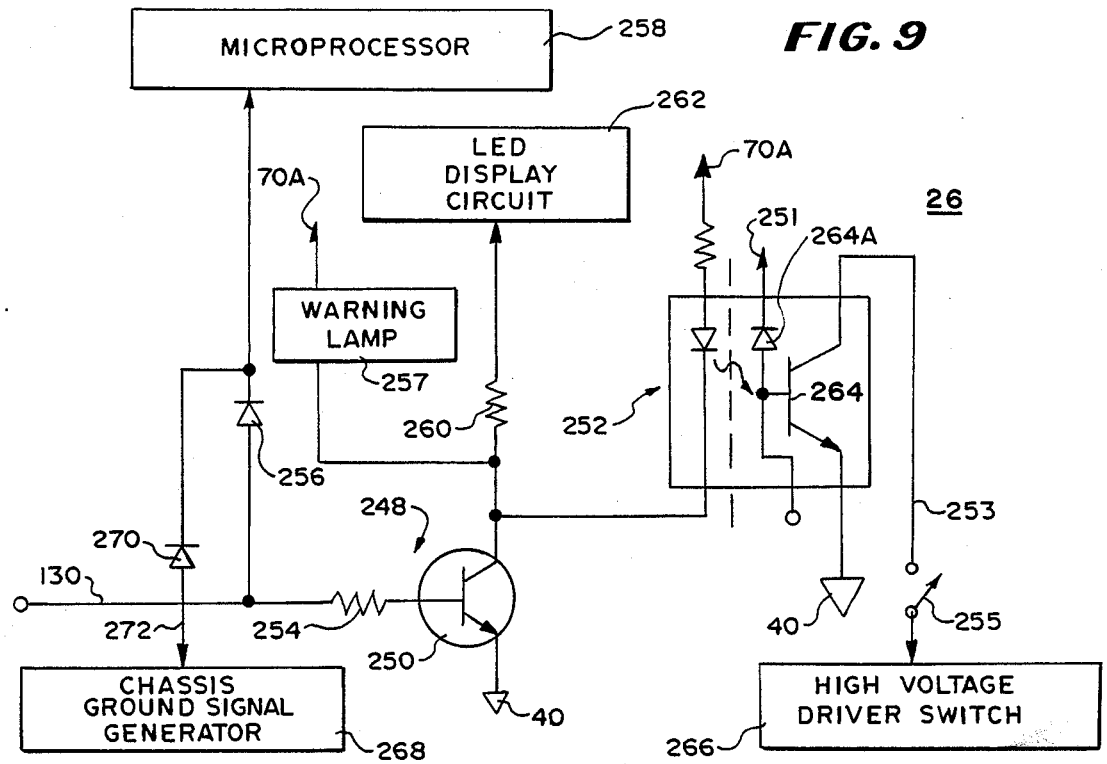
FIG. 9 is a partly schematic and partly block diagram of a portion of the embodiment of FIG. 1 generally referred to an indicator and control circuit.

In FIG. 9, there is shown the indicator and control circuit 26, partly schematic and partly in block diagram form, having a switch circuit 248, microprocessor 258, LED display circuit 262, chassis ground signal generator 268, high voltage driver switch 266, and an optical circulation circuit 252 and warning panel lamp 257. The switch circuit 248 receives a signal on conductor 130 which indicates either that there is a ground fault or not and applies signal to other circuits including the optical isolation circuit 252. The chassis ground signal generator 268 generates a signal indicating if the chassis ground is electrically connected to form an equivalent earth ground.

To provide signals representative of ground faults or no ground faults, the switch circuit 248 includes a NPN transistor 250 having its base electrically connected to conductor 130 through a 10K resistor 254. The emitter of the transistor 250 is electrically connected to common electrical ground 40 and its collector is electrically connected to an LED display circuit 262 through a 1K resistor 260 as well as to the optical isolation circuit 252 and warning panel lamps 257.

To provide signals to the microprocessor 258, conductor 130 is electrically connected through the forward resistance of a diode 256 to the microprocessor 258 and the chassis ground signal generating circuit 268 is electrically connected through conductor 272 and the forward resistance of a diode 270 to the microprocessor 258 to enable the microprocessor to receive signals indicating the absence of a ground connection to chassis. The transistor 250 is a 2N3710 transistor and the diodes 270 and 256 are IN914 diodes. The microprocessor 258 is not part of the invention and may be any microprocessor equipped with an input device so as to record data concerning the operation of the power supply.

To provide output signals, the optical isolation circuit 252 is a 6N136 high-speed optoisolator manufactured by Hewlett-Packard, Silicon Valley, Calif., which is electrically connected at 70A to a source of a positive 15 volts through a 2.2K resistor and the forward resistance of an internal light emitting diode to the collector of the diode 264A with the diode being an LED (light emiting diode) diode which is illuminated when a positive going signal on conductor 130 causes the diode 264A to conduct current from positive supply 251. This causes transistor 264 to conduct.

Upon becoming conductive, this NPN transistor 264 which is an integral part of the 6N136 optoisolator in the optoisolator 258 grounds conductor 253 which is electrically connected to the high-voltage driver switch 266 through a manual switch 255. With the manual switch closed, a signal on conductor 130 indicating a fault, the high-voltage driver switch 266 shuts off the high-voltage drive circuit of the power supply 10 (FIG. 1). The switch 255 permits manual disconnecting and connecting of the ground fault detector.

When switch 250 conducts, lamp 257 is illuminated by conduction of current from positive source 70A and LED display circuit 262 is disconnected; when it does not conduct, lamp 257 is extinguished and the LED display circuit 262 is illuminated. During a ground fault, switch 250 and transistor 264 conducts and the high-voltage driver switch de-energizes the high voltage drivers to turn off the high voltage. Other alarms may obviously be included such as, for example, the microprocessor 258 may include audible alarms.

Figure 10:
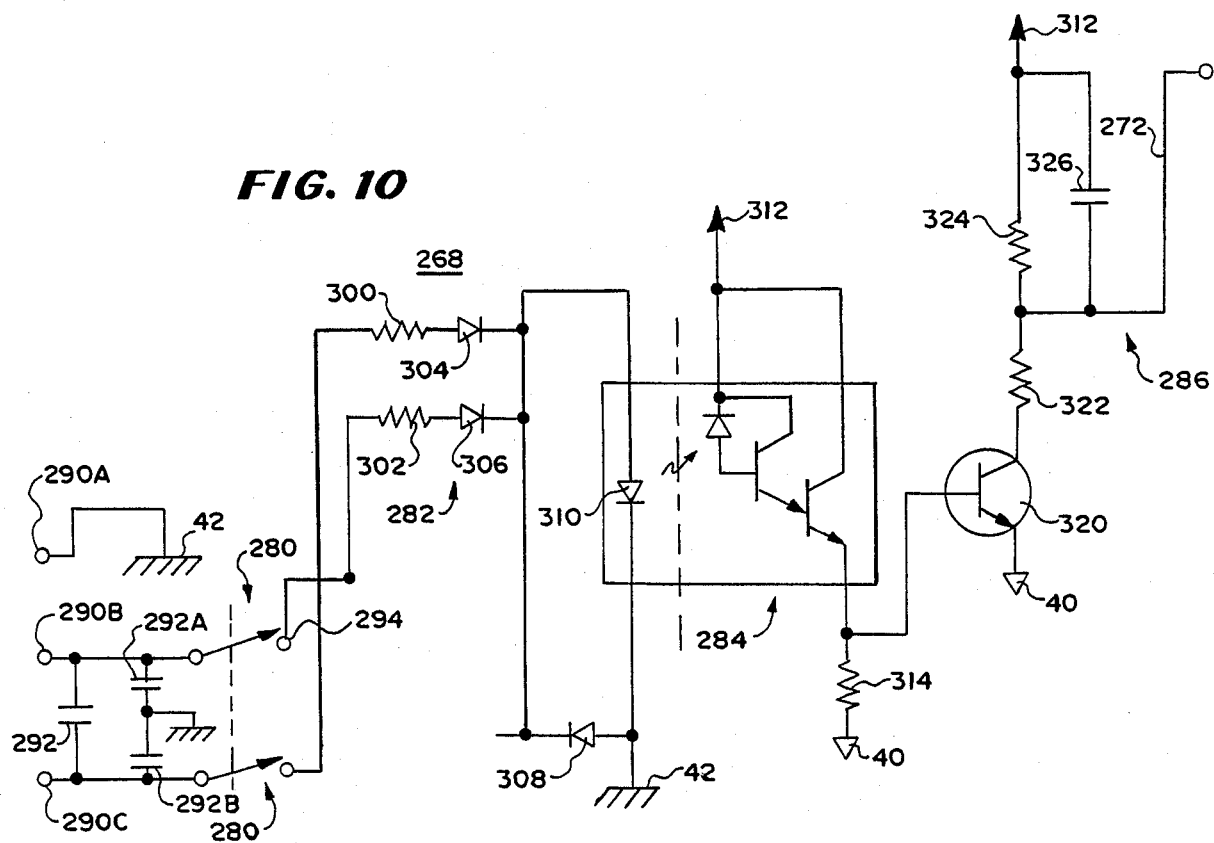
FIG. 10 is a schematic circuit diagram of a portion of the circuit and block diagram of FIG. 9.

In FIG. 10, there is shown a schematic circuit diagram of the chassis ground signal generator 268 having a three conductor mains power connection 290A, 290B and 290C. There are also an AC switch 280, a detection circuit 282, an optical isolation circuit 284, and a signal generator 286, electrically connected through conductor 272 to the microprocessor (FIG. 9) to indicate that the circuit is not properly grounded to the chassis. The earth lead is 290A and the power leads are 290B and 290C.

With this arrangement, earth grounding to the chassis may be ensured upon activation of the power supply itself to provide proper grounding for the ground fault detector and other portions of the power supply.

The AC switch 280 is part of the on-off switch of the power supply and electrically completes a circuit across the 0.22 uf, 1 kilovolt filter capcitor 292 and 0.005 uf 600 volt filter capacitors 292A and 272B to the AC mains supply to supply electric power to the power supply 10 (FIG. 1) and simultaneously establishes an AC circuit through the detection circuit 282.

To detect a connection between chassis ground and earth ground, the detection circuit 282 includes two 390K resistors, 300 and 302, two IN5404 diodes 304 and 306, and one IN5060 diode 308. The cathodes of the diodes 304 and 306 are electrically connected together and to the cathode of the diode 308, its anode being electrically connected to chassis ground 42. The anodes of the diodes 304 and 206 are electrically connected across the source of main AC power through corresponding ones of the resistors 300 and 302 to provide a circuit which supplies rectified positive potential through a diode 310 within the opto-electrical isolator 284 to chassis ground 42 and the forward resistance of the diode 308.

When chassis ground 42 is disconnected from earth ground, as would be the case if the power mains connection at 290A were broken, no current flows through diode 304 and 306 and as a result diode 310 is not illuminated, thus the optical isolator 284 does not produce an output amount through its transistors.

The optical isolator 284 is electrically connected to a source of a positive 5 volts 312 and through internal transistors to ground 40 through a 47K resistor 314 and to the signal generator 286. With this arrangement, a positive signal is applied by the optical isolation circuit 284 to the signal generating circuit 286 whenever the circuit is electrically connected to chassis ground.

The signal generator 286 includes a 2N3704 transistor 320, a 470 ohm resistor 322, a 4.7K resistor 324, and a 22 mf capacitor 326. One plate of the capacitor 326 and one end of the resistor 324 are electrically connected to a source 312 of positive voltage and the other plate of the capacitor 326 and other end of the resistor 324 are electrically connected through resistor 322 to the collector of the transistor 320 and to conductor 272 so that, when a positive signal is applied to the base of the transistor 320 indicating the presence of a chassis ground connection, current flows through the transistor 320 causing the potential on conductor 272 to drop from a positive 5 volts to a voltage slightly above ground level, thus applying a low signal to the microprocessor and causing an alarm to be given.

In the operation of the ground fault detector 14 within the power supply 10, the allowable resistance component of AC leakage current, is adjusted with the range correction circuit 112 (FIG. 4 and FIG. 6). The ground fault current signal generator 20 (FIG. 1 and FIG. 2) generates a signal indicating the AC leakage current and applies it to the real component of current detector 22 (FIG. 1 and FIG. 3) which selects the in phase component representing the real component of AC leakage current for application to the level detector 24 (FIG. 1 and FIG. 4). The level detector 24 compares the real component of AC leakage current with the preset level and provides a ground fault signal to the indicator and control circuit 26 if needed.

To adjust the level of permissible leakage current, the potentiometer tap 196 (FIG. 6) in the range correction circuit 112 (FIG. 4 and FIG. 6) is adjusted. Normally, the adjustment will be to a level of approximately 2 megohms for the real component of AC leakage impedance for a 1000 volt power supply, 4 megohms for a 2000 volt power supply or 8 megohms for a 4000 volt power supply, and generally to 500 microamps leakage at the maximum possible putput voltage. However, this adjustment may be to other various depending on the power supply and the degree of caution to be taken.

When the power supply is energized, the main AC power is applied across the detector circuit 282 (FIG. 10) of the indicator and control circuit 26 (FIG. 1 and FIG. 9). In the absence of a chassis to earth ground connection, this circuit transmits a positive going signal to conductor 272 (FIG. 9 and FIG. 10) indicating no ground connection and an alarm is given.

To generate a signal representing the AC impedance, a voltage regulator 32 (FIG. 2) in the ground fault current signal generator 20 (FIG. 1 and FIG. 2) establishes a positive 7.5 volt potential on one side of the resistor 30 (FIG. 2). The source 68 of 7.5 volts is at AC ground because of the low incremental impedance of zener diode 50 and the low impedance of 10 uf capacitor 46. Leakage current flowing to ground through capacitor 66 and to AC ground through resistor 30 establishes an AC potential across the resistor 30 and capacitor 66 which is applied to conductor 60 through resistor 62 (FIG. 2) and to conductor 64 in the output circuit.

To generate a signal representing only the real component of the AC leakage current, the AC leakage current signal on conductor 64 is transmitted to the analog gate 84 (FIG. 3) of the real component the AC leakage current detector (22, FIGS. 1 and 3) which blocks it unless it is opened by the switch 82. It is closed to prevent the signal from being applied to conductor 100 except in phase with the transformer potential so that only that part of the AC leakage current signal which is in phase with the voltage on the secondary of the power supply transformer is applied to the conductor 100. The voltage at transformer lead 78 is in phase with the voltage on transformer lead 74.

To generate a signal whenever the real component of the AC leakage current exceeds the preset level, a signal from the transformer is processed to adjust for variations in the mains supply and for ranges of power supply output, within the level detector 24 (FIG. 1 and FIG. 4) and applied to the inter-range conformance setting potentiometer 170 (FIG. 6) and to the preset potentiometer 196 (FIG>6). The potential from the adjustable potentiometer tap 197 is applied to one input terminal of the comparator 116 (FIG. 4 and FIG. 8) and the signal representing the real component of the AC leakage current is applied to the other input terminal. Suitable setting of potentiomet 196 causes the detector to detect capacitive leakage that are large enough to store a dangerous charge. These capacitances have AC impedances much lower than the acceptable leakage resistances.

Whenever the signal representing the real component of leakage current exceeds the preset level, a positive going output signal is developed at the output of the comparator 230 (FIG. 8) resulting in a positive signal on conductor 130.

To provide the appropriate indications, the positive going signal on conductor 130 is conducted to the microprocessor by coupling diode 256 and causes transistor 250 (FIG. 9) to become conducting, thereby causing a potential to be transmitted: (1) to LED display circuit 260 to turn it off and to illuminate the ground fault warning lamp 257; and (2) to drive the optical isolation circuit 252 to signal the high-voltage driver switch 266 to turn off the power drivers if switch 255 is closed.

As can be understood from the above description, the method and apparatus for detecting ground faults in accordanc with this invention has several advantages, such as: (1) it permits the leakage capacitance to ground to vary over a wide range without causing the preset level to activate the ground fault condition to be activated; (2) it permits the power supply to be used in higher leakage capacitance configurations or with high capacitance equipment to which it may supply power; (3) it is easily adjustable and adaptable to different circuit conditions; (4) it enables the level of resistance to ground which is considered to be a ground fault to be set at a standard that takes into consideration the acceptable circuit condition that provides the largest AC leakage current and it does this by increasing the value of permissible admittance that is measured as the phase difference is increased by leakage capacitance; and (5) it permits detection of leakage capacitances that are larger than the wide range of acceptable, safe capacitances.

Although a preferred embodiment of the invention has been described with some particularlity, many modifications and variations are possible in the preferred embodiment without deviating from the invention. Accordingly, it is to be understood, within the scope of the appended claims, the invention may be practiced other than as specifically described.

What is claimed is:

1. A ground fault detector for a DC power supply comprising:

means for generating an alternating current leakage test signal and applying it to a DC power supply whereby an alternating current leakage current is provided through a leakage impedance;

circuit means adapted to be electrically connected to a DC power supply, for generating a first signal representing at least a portion of the antecedant alternating current leakage current; flowing to electrical common ground of a DC power supply, whereby said first signal has a real and an imaginary component;

means for generating a second signal representing the real component of said first signal, whereby the second signal represents the resistive component of the alternating current leakage impedance; and means for generating a third signal when said second signal exceeds a predetermined limit indicating the leakage impedance has fallen below the permissible leakage impedance.

2. A ground fault detector in accordance with claim 1 in which the ground fault detector:

is adapted to be connected to a DC power supply that includes transformer secondary winding means having an AC voltage on it; and said means for generating a second signal includes means, adapted to be electrically connected to a power supply, for generating a second signal representing the portion of said first signal which is in phase with a voltage in a transformer secondary winding means of a DC power supply.

3. A ground fault detector in accordance with claim 2 in which said means for generating a second signal comprises:

gating means electrically connected to open to pass a portion of said first signal and closing to block a second portion of said first signal; and control means operatively connected to a DC power supply to open said gate to pass one of said first and second portions, whereby said portion of said first signal which is in phase with the voltage in the secondary windings of a DC power supply transformer is obtained.

4. A ground fault detector in accordance with claim 3 in which said control means includes means for opening said gating means when said voltage in a transformer secondary winding means of a DC power supply is between 0 and 15 degrees of the positive going wave and for closing said gating means when it is between 165 to 180 degrees of the positive portion of a cycle of alternating current voltage in a transformer secondary winding means of a DC power supply.

5. A ground fault detector in accordance with claim 4 in which the predetermined limit is adjustable.

6. A ground fault detector in accordance with claim 5 in which said circuit means adapted to be electrically conducted to a DC power supply for generating a first signal includes an AC circuit for shifting said alternating current leakage current a number of degrees to compensate for capacitance.

7. A ground fault detector in accordance with claim 6 further including a correction means for varying said predetermined limit in accordance with variations in the voltage in a transformer secondary winding means of a DC power supply.

8. A ground fault detector in accordance with claim 7 in which a DC power supply includes a plurality of different ranges of output voltages and said correction means includes means for selecting a predetermined limit in accordance with a selected one of said ranges.

9. A ground fault detector in accordance with claim 8 further including means for detecting the absence of a ground to chassis.

10. A ground fault detector in accordance with claim 9 including a lamp illuminated when there is no ground fault by said means for generating a signal and a second lamp indicated when there is a ground fault.

11. A ground fault detector in accordance with claim 1 in which said means for generating a second signal comprises:

gating means electrically connected to open to pass a portion of said first signal and closing to block a second portion of said first signal; and control means operatively connected to said DC power supply to open said gate to pass one of said first and second portions, whereby said portion of said first signal which is in phase with the voltage in a secondary windings of the DC power supply transformer is obtained.

12. A ground fault detector in accordance with claim 11 in which said control means includes means for opening said gating means when said voltage in a transformer secondary winding means of a DC power supply is between 0 and 15 degrees of the positive going wave and for closing said gating means when it is between 165 to 180 degrees of the positive portion of a cycle of alternating current voltage in a transformer secondary winding means of a DC power supply.

13. A ground fault detector in accordance with claim 12 in which the predetermined limit is adjustable.

14. A ground fault detector in accordance with claim 13 in which said circuit means adapted to be electrically connected to a DC power supply for generating a first signal includes an AC circuit for shifting said alternating current leakage current a number of degrees to compensate for capacitance.

15. A ground fault detector in accordance with claim 14 further including a correction means for varying said predetermined limit in accordance with variations in a voltage in the transformer secondary winding means of a DC power supply.

16. A ground fault detector in accordance with claim 1 further including means, operatively connected to a DC power supply, for opening said gating means when said voltage in a transformer secondary winding means of a DC power supply is between 0 and 15 degrees of the positive going wave and for closing said gating means when it is between 165 to 180 degrees of the positive portion of a cycle of alternating current voltage in a transformer secondary winding means of a DC power supply.

17. A ground fault detector in accordance with claim 16 in which the predetermined limit is adjustable.

18. A ground fault detector in accordance with claim 17 in which said circuit means adapted to be electrically connected to a DC power supply for generating a first signal includes an AC circuit for shifting said alternating current leakage current a number of degrees to compensate for capacitance.

19. A ground fault detector in accordance with claim 18 further including a correction means for varying said predetermined limit in accordance with variations in a voltage in the transformer secondary winding means of a DC power supply.

20. A ground fault detector in accordance with claim 1 in which the predetermined limit is adjustable.

21. A ground fault detector in accordance with claim 20 in which said circuit means adapted to be electrically connected to a DC power supply for generating a first signal includes an AC circuit for shifting said alternating current leakage current a number of degrees to compensate for capacitance.

22. A ground fault detector in accordance with claim 21 further including a correction means for varying said predetermined limit in accordance with variations in a voltage in the transformer secondary winding means of a DC power supply.

23. A method of detecting ground faults in a DC power supply comprising:
generating a first signal representing at least a portion of the alternating current leakage curent flowing to AC common ground of a power supply, whereby said first signal has a real and an imaginary component;
generating a second signal representing the real component of said first signal, whereby the second signal represents the resistive component of the alternating current leakage impedance; and
generating a signal when said second signal exceeds a predetermined limit indicating the leakage impedance has been reduced below the permissible leakage impedance.

24. A method in accordance with claim 23 in which said step of generating said second signal includes the substep of generating a second signal representing the portion of said first signal which is in phase with the voltage in a secondary winding of a DC power supply.

25. A method in accordance with claim 24 in which said step of generating a second signal comprises the substeps of:
passing a portion of said first signal and blocking a second portion of said first signal; and
passing one of said first and second portions to a detector, whereby said portion of said first signal which is in phase with the voltage in a secondary winding of a DC power supply transformer is obtained.

26. A method in accordance with claim 25 wherein said portion of first signal is passed when the voltage in a secondary transformer of a DC power supply is between 0 and 15 degrees of the positive going wave and blocking it between 15 to 0 degrees of a decreasing positive portion of a cycle of alternating current voltage in the secondary of the DC power supply transformer.

27. A method in accordance with claim 26 wherein said portion is passed at approximately 7 degrees from the crossover point of the positive going wave form of the alternating current voltage in the secondary of a power supply transformer and the rest of the signal is blocked at approximately 7 degrees before the crossover point of the negative going positive half sign wave.

28. A method in accordance with claim 26 wherein said first signal is phase shifted by a number of degrees to compensate for internal capacitance of a circuit in a power supply.

29. A method in accordance with claim 28 wherein said predetermined level is varied in accordance with variations in the voltage in the secondary of transformers of a power supply.

* * * * *